United States Patent [19]

Yariv et al.

[11] 3,835,407

[45] Sept. 10, 1974

[54] MONOLITHIC SOLID STATE TRAVELLING WAVE TUNABLE AMPLIFIER AND OSCILLATOR

[75] Inventors: Amnon Yariv; Avraham Gover, both of Pasadena, Calif.

[73] Assignee: California Institute of Technology, Pasadena, Calif.

[22] Filed: May 21, 1973

[21] Appl. No.: 362,821

[52] U.S. Cl. ................ 330/5, 330/38 R, 331/107 R

[51] Int. Cl. ............................................ H03f 3/04

[58] Field of Search ............ 330/5, 38 R, 38 M, 43; 331/82, 107 R, 107 G

[56] References Cited

UNITED STATES PATENTS

| | | | |
|---|---|---|---|
| 3,401,347 | 9/1968 | Sumi | 330/5 |
| 3,453,502 | 7/1969 | Sandbank | 331/107 G X |
| 3,466,563 | 9/1969 | Thim | 331/107 G X |
| 3,526,844 | 9/1970 | Bartelink et al. | 331/107 G X |
| 3,555,444 | 1/1971 | Hines | 331/107 G |
| 3,621,411 | 11/1971 | Wisseman | 330/5 |
| 3,621,462 | 11/1971 | Hammer et al. | 331/107 G X |

OTHER PUBLICATIONS

Lean et al. "Gallium Arsenide Gunn Oscillator to Excite Surface Acoustic Waves," IBM Technical Disclosure Bulletin, Vol. 13, No. 8, January 1971, pp. 2411, 2412.

*Primary Examiner*—Herman Karl Saalbach
*Assistant Examiner*—James B. Mullins
*Attorney, Agent, or Firm*—Lindenberg, Freilich, Wasserman, Rosen & Fernandez

[57] ABSTRACT

A travelling wave amplifier of signals in the millimeter wavelength range consists of a monolithic solid state waveguide structure wherein space harmonics of the input electromagnetic energy wave (signals) are generated due to periodic corrugations of the guide's top surface. The waveguide structure includes a current conductive layer supportive of a stream of electrons with an electron velocity $v_e$, the stream of electrons being located where the amplitude of the spatial first harmonic is a maximum. The corrugation periodicity L is selected so that the equality $v_e = K(\omega/2\pi) L$ is satisfied. In the equality, $\omega$ is the angular frequency of the input wave and K is a factor which is not less than and on the order of one.

10 Claims, 3 Drawing Figures

PATENTED SEP 1 0 1974 3,835,407

MONOLITHIC SOLID STATE TRAVELLING WAVE TUNABLE AMPLIFIER AND OSCILLATOR

BACKGROUND OF THE INVENTION

1. Field of the Invention

The present invention generally relates to solid state amplifiers and, more particularly, to a monolithic solid state travelling wave amplifier or oscillator in the millimeter wavelength range.

2. Description of the Prior Art

The desirability of being able to amplify electromagnetic wave energy at all wavelengths including the millimeter range is well known. Herebefore, microwave travelling wave tube amplifiers have been used for such purposes. Their theory of operation which is well known is amply described in "Travelling Wave Tubes", by J. R. Pierce, published in 1950. Basically, the amplification is achieved by the interaction of the wave energy in a relatively bulky waveguide with the electrons in an electron beam which is made to pass through the waveguide.

In recent years, considerable scientific attention has been directed to thin film dielectric waveguides and their usefulness as amplifiers or oscillators. Also, attention has been directed to the theory of interaction of drifting carriers in semiconductors with electromagnetic energy waves in external travelling wave circuits or guides for the purpose of signal amplification. Various articles appeared in the pertinent literature on these subjects. In these articles, the wave to be amplified is in a travelling waveguide which is separate and spaced apart from the semiconductor in which the electrons drift. Consequently, the previously proposed amplifiers are quite bulky. Furthermore, the energy conversion efficiency is low due to the spacing between the waveguide and the current-carrying semiconductor. It is believed that significant advantages can be realized by providing a monolithic structure or chip which can serve both as the waveguide and the current-carrying medium, for purposes of signal amplification.

OBJECTS AND SUMMARY OF THE INVENTION

It is a primary object of the present invention to provide a new solid state travelling wave amplifier.

Another object of the present invention is to provide a new solid state travelling wave amplifier for signals in the millimeter range.

A further object of the present invention is to provide a solid state travelling wave device in a monolithic structure capable of amplification or oscillation of signals in the millimeter range.

These and other objects of the present invention are achieved by providing a monolithic structure supportive of a beam of electrons at an adjustable electron velocity definable as $v_e$. The monolithic structure also consists of a dielectric waveguide whose surface is corrugated to slow down the phase velocity of a selected spatial harmonic of an electromagnetic wave which is supported by the waveguide. The phase velocity, definable as $v_{ph}$ is slowed down so that $v_e/v_{ph} = K$, where K is a factor generally greater than 1, but of a value which results in optimum gain, i.e., the largest transfer of energy from the electron beam to the wave to be amplified. In the present invention, the electron beam is made to flow in the solid state monolithic structure at a location where the amplitude of the harmonic to be amplified is a maximum (or near maximum), thereby insuring optimum interaction between the wave and the electron beam.

The novel features of the invention are set forth with particularity in the appended claims. The invention will best be understood from the following description when read in conjunction with the accompanying drawings.

DESCRIPTION OF THE PREFERRED EMBODIMENTS

Figure 1:
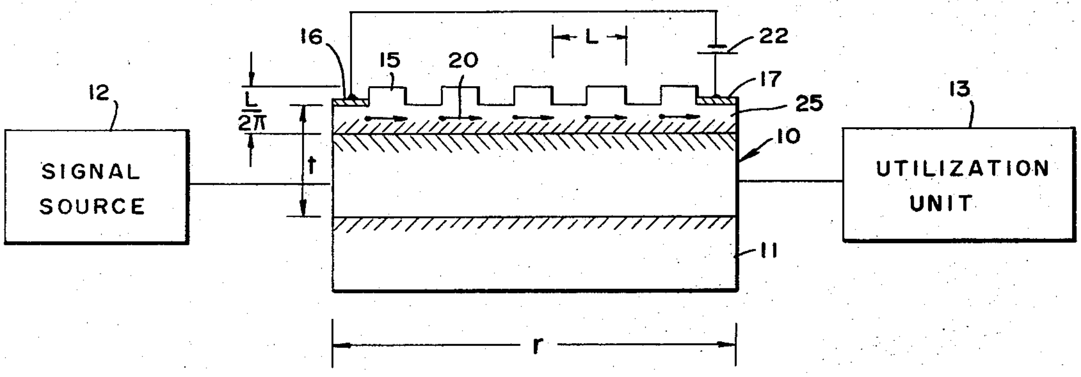
FIG. 1 is a diagram of one embodiment of the invention.

Attention is directed to FIG. 1 wherein numeral 10 designates one embodiment of a dielectric solid state travelling waveguide which is formed on a substrate 11. The function of waveguide 10 is to amplify signals from a source 12, and direct the amplified signals to a utilization unit 13. As will be pointed out hereafter, the invention is particularly directed to amplify signals in the millimeter range. The guide 10 of length $r$ in the direction of wave energy propagation and of thickness t is shown having an upper surface 15 which is periodically corrugated in the direction of wave propagation. The corrugation period is designated by L. The top portion of the guide 10 of a thickness, which is preferably in the range of $L/2\pi$, is treated, such as by appropriate doping, so that when a voltage difference is applied between electrodes 16 and 17 at opposite ends of the guide 10, a stream of electrons flows between the electrodes in the top portion of the guide. The electron stream is represented by arrows 20, and the voltage difference between the two electrodes is assumed to be provided by a battery 22. Thus, the top portion of the guide 10, which is designated by numeral 25, acts as a current-conducting layer.

An analysis of the behavior of the guide 10 with the corrugated surface 15 reveals that when a wave propagates through the guide, the corrugations generate space harmonics. The phase velocity of each of the harmonics, say the $m$th one, is expressable as $$v_{(ph)m} = \omega/(\beta_o + 2\pi/L\ m),\ m = \pm1, \pm2, \pm3, \ldots,$$

where $\omega$ is the angular frequency of the wave, $m$ is the harmonic number and $\beta_o$ is approximately the propagation constant of the waveguide without corrugation.

It also has been discovered that the spatial first harmonic is concentrated near the corrugated top surface 15 and decays exponentially with increased distance therefrom. In the embodiment of the present invention, since the stream of electrons is confined to the conducting layer 25, which is near surface 15, optimum interaction can be achieved between the propagating wave and the electron stream. Such interaction, i.e., energy transfer is achievable when the phase velocity of the first harmonic is controlled, i.e., slowed down, to be less than the electron velocity in the electron stream. Defining the electron velocity as $v_e$, amplification is achievable when $v_e > v_{(ph)1}$.

As will be appreciated from the following discussion, since the maximum electron velocity in a solid is in the order of one or two times $10^7$cm/sec., i.e., about 1/1000 of the speed of light c, the corrugation periodicity L has to be in the micron range. Therefore $2\pi/L$ is considerably greater than $\beta_0$ and consequently, the phase velocity of the first harmonic can be expressed as $$v_{(ph)1} = (\omega/2\pi)L.$$

Thus, amplification is achieved whenever $$v_e > (\omega/2\pi)L.$$

The relationship between $v_e$ and $v_{(ph)1}$ can be expressed by the following equality $$v_e = K\ (\omega/2\pi)\ L.$$

Figure 2:
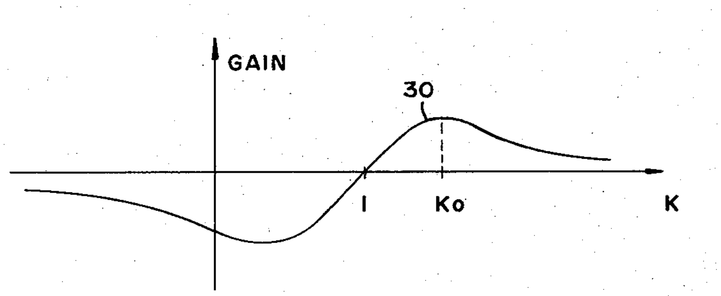
FIG. 2 is a curve useful in explaining one aspect of the invention.

Line 30 in FIG. 2, to which reference is made, diagrams the amplification with respect to K. As is appreciated by those familiar with the art, for amplification to occur, K must be somewhat greater than 1. The exact value of K for optimum amplification designated as $K_o$, depends on various factors including temperature. Generally, it is less than 2 and closer to 1. However, in practice, as long as K is greater than but on the order of 1, amplification is achieved.

The above equality may be written as $$v_e = K\ (c/\lambda)L.$$

Thus, $K = v_e/c \cdot \lambda/l$, where $\lambda$ is the wavelength of the input signals or wave from source 12.

As is appreciated, the maximum electron velocity in a solid is on the order of 1/1000 of the speed of light. Thus, to satisfy the above equality with K on the order of 1, the wavelength $\lambda$ has to be in the order of 1,000 times L. Various techniques are known to form corrugations in the top surface of a dielectric material. One technique is known as ion milling. To date, with such techniques, the smallest periodicity attainable is about a few tenths of a micron, i.e., a few times 1/10000 mm. Thus, with present corrugation-forming technology, $\lambda$ is limited to be in the millimeter range.

From the foregoing, it should be appreciated that as long as K is greater than 1, at least some amplification takes place. The amplification is achieved over a band of frequencies rather than at a single frequency (or wavelength). However, the wavelength which experiences the largest amplification is the one which satisfies the equality $$K_o = v_e/c \cdot \lambda/L.$$

In practice, L is fixed and $K_o$ is the same under similar operating conditions. Thus, the wavelength $\lambda$ which experiences the largest amplification or gain can be changed by adjusting $v_e$ to satisfy the above equality. This can be achieved by varying the voltage provided by battery 22, which for explanatory purposes can be assumed to be a variable voltage source. It is thus seen that the amplifier of the present invention is tunable. By changing $v_e$, the amplifiable band (or amplification spectrum) is shifted.

From the foregoing, it is thus seen that guide 10 which is a monolithic structure performs two double functions thereby enabling signals in the millimeter range to be amplified therein. It acts as a waveguide for the signals. Its corrugated surface 15 with a corrugation periodicity L causes spatial harmonics of the electromagnetic energy wave to be generated. The top layer 25 of guide 10, near surface 15, is formed as a current conductive layer to enable a stream of electrons to pass therethrough in the direction of wave propagation. The electron velocity $v_e$ is adjustable by controlling the voltage difference between a pair of electrodes connected to the top surface.

As long as $v_e/c \cdot \lambda/L$, is greater than one, amplification takes place. Thus, amplification occurs over a band of wavelengths rather than at a fixed wavelength. By varying $v_e$ (up to a maximum attainable velocity in a solid), the band over which amplification takes place is shifted. Thus, the guide acts as a monolithic solid-state travelling wave tunable amplifier.

In the present invention, the electron stream is in layer 25 near the corrugated top surface 15 whereat the amplitude of the first harmonic is a maximum. Thus, optimum interaction between the wave and the electrons take place, thereby resulting in high energy conversion efficiency. This is most significant and greatly distinguishes the present invention from prior art travelling wave amplifiers. In the prior art, travelling wave amplifiers, including those in which the electrons travel in a semiconductor, a separate guide is used for the wave. Thus, the location where the amplitude of the interacting space harmonic is a maximum, is spaced apart from the electron stream location. Consequently, the conversion efficiency is lower than that realizable with the present invention.

The guide 10 may be formed from various dielectric materials, known to those familiar with the art. These include, though not limited tO GaAs, InAs, InSb, and Silicon. The guide 10 may be grown as deposited on the substrate 11. The corrugations are subsequently formed, and the top layer of the guide doped to produce its current conductive characteristics. When using Silicon, the device may be produced compatible with conventional integrated circuit fabrication techniques. Thus, it can be integrated into an integrated circuit with other components.

Preliminary theoretical calculations for a guide of GaAs of a thickness of 0.5 mm and a doping level of $5 \times 10^{17}\ cm^{-3}$, operable at a temperature of 77°K and with a corrugation periodicity of $L = 1\mu$ exhibits a ratio of power output, $P_{out}$ to power input, $P_{in}$ which is equal to $e^{Gr}$, where $G = 30\ cm^{-1}$ and $r$ is the guide length. That is, $$P_{out}/P_{in} = e^{Gr}.$$

Thus, for example, for $r = 2mm$, $P_{out}/P_{in} = e^6 = 400$. Of course, greater amplification factors are realizable by increasing the guide length.

Figure 3:
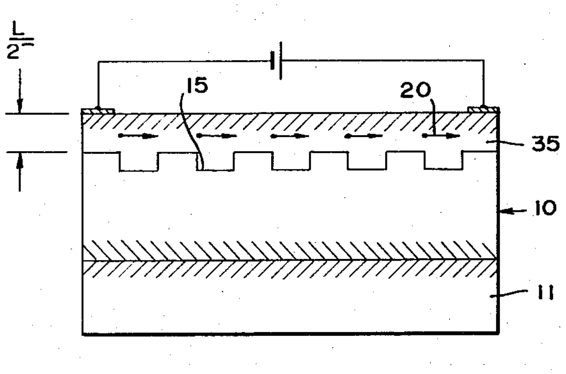
FIG. 3 is a diagram of another embodiment of the invention.

In FIG. 1, the conductive layer 25 is assumed to be part of the guide 10 below the corrugated surface 15. If desired, a conductive layer may be deposited on top of the corrugated surface 15. Such a conductive layer is designated in FIG. 3 by numeral 35 and is shown deposited on top of guide 10. Together the two form a monolithic structure and function in a manner identical with that described for the embodiment shown in FIG. 1.

Although herebefore the novel thin film waveguide has been described as a tunable travelling wave amplifier, it can also be used as an oscillator. This may be achieved by externally feeding the output to the input, or by using the internal feedback mechanism which is introduced when the electron stream transfers energy to the $m \approx -1$ harmonic. The $-1$ space harmonic has the same group velocity as the principal harmonic and opposite phase velocity. When operated as an oscillator, the resulting electromagnetic wave is emitted in a direction opposite to the direction of the electron beam.

Although particular embodiments of the invention have been described and illustrated herein, it is recognized that modifications and variations may readily occur to those skilled in the art and consequently, it is intended that the claims be interpreted to cover such modifications and equivalents.

What is claimed is:

1. A solid state travelling wave device comprising:

a substantially dielectric travelling waveguide supportive of electromagnetic wave of an angular frequency $\omega_1$, said dielectric waveguide being characterized by a current conductive layer therein adjacent a top surface thereof, and supportive of a stream electrons in the direction of the wave propagation through said dielectric waveguide, the electron velocity being definable as $v_e$, the top surface of said dielectric waveguide being corrugated with a corrugation periodicity of L satisfying the equality $v_e = K\ \omega_1/2\pi\ L$, wherein K is a factor greater than and on the order of one; and means including a pair of electrodes in electrical contact with said conductive layer in said dielectric waveguide for controlling the electron velocity as a function of the potential difference between said electrodes.

2. The solid state travelling wave device as described in claim 1 wherein L is less than the micron range, and the thickness of said current conductive layer of said dielectric waveguide from the top surface thereof being of the order of $L/2\pi$.

3. The solid state travelling wave device as described in claim 1 further including input means for directing an input electromagnetic wave of an angular frequency $\omega_1$ to said waveguide to be propagated therethrough, whereby an amplified electromagnetic wave at $\omega_1$ exits said dielectric waveguide through an end opposite the end through which said input wave enters said waveguide as a result of energy exchange between the stream of electrons and the spatial first harmonic of said wave generated in said waveguide.

4. A solid state travelling wave amplifier comprising:

a dielectric travelling waveguide supportive of an electromagnetic wave of an angular frequency $\omega$, and having a corrugated top surface with a corrugation periodicity definable as L;

means including a solid-state layer deposited on said corrugated top surface of said dielectric waveguide for providing a stream of electrons in said layer with an electron velocity, definable as $v_e$, wherein $v_e = K\ (\omega/2\pi)L$, where K is factor greater than but on the order of one; and input means for directing electromagnetic wave energy at an angular frequency $\omega$, to said dielectric waveguide in a direction parallel to the electron stream.

5. The solid state travelling wave amplifier as described in claim 4 wherein the thickness of said solid-state layer is on the order of $L/2\pi$ and L is less than one micron.

6. The solid state travelling wave amplifier as described in claim 4 wherein L is on the order of not more than a few microns, and wherein the thickness of said solid-state layer is on the order of $L/2\pi$.

7. In a monolithic solid state travelling wave amplifier the arrangement comprising:

a substantially dielectric travelling waveguide supportive of an electromagnetic wave of a wavelength $\lambda$, and having a corrugated top surface extending between first and second opposite sides of said waveguide, said top surface being corrugated with a corrugation periodicity, definable as L, whereby when an electromagnetic wave propagates through said waveguide spatial harmonics of said wave are generated therein, said dielectric waveguide being characterized by a current-conductive layer included therein and extending downwardly from said top surface;

potential means coupled to said current-conductive layer for inducing an electron stream to flow in said layer in a direction parallel to said top surface in close proximity thereto with an electron velocity definable as $v_e$, wherein $K = v_e/c \cdot \lambda/L$, where K is a factor greater than but on the order of one and $c$ is the speed of light; and input means for directing an electromagnetic wave of wavelength $\lambda$ to the first end of said waveguide.

8. The arrangement as described in claim 7 wherein said potential means comprise means for varying the electron velocity in said electron stream.

9. The arrangement as described in claim 8 wherein L is in the micron range and $v_e$ is on the order of one-tenth $c$ and the thickness of said current conductive layer of said dielectric waveguide is of the order of $L/2\pi$.

10. The arrangement as described in claim 7 wherein $v_e$ is on the order of one-tenth $c$, L is less than 1 micron and the thickness of said current conductive layer of said dielectric waveguide is of the order of $L/2\pi$.

* * * * *

UNITED STATES PATENT OFFICE
CERTIFICATE OF CORRECTION

Patent No. 3,835,407 Dated September 10, 1974

Inventor(s) Amnon Yariv et al.

It is certified that error appears in the above-identified patent and that said Letters Patent are hereby corrected as shown below:

Column 4, line 25, "tO" should read -- to --; line 26, "as" should read -- or --. Column 5, line 12, Claim 1, after "stream" insert -- of --; line 49, claim 4, after "is" insert -- a --.

Signed and sealed this 12th day of November 1974.

(SEAL)
Attest:

McCOY M. GIBSON JR.
Attesting Officer

C. MARSHALL DANN
Commissioner of Patents

FORM PO-1050 (10-69)

USCOMM-DC 60376-P69
U.S. GOVERNMENT PRINTING OFFICE : 869-930